(12) United States Patent
Hammett

(10) Patent No.: US 10,905,027 B2
(45) Date of Patent: Jan. 26, 2021

(54) UNDERGROUND EQUIPMENT VAULT SYSTEM

(71) Applicant: William F. Hammett, Sonoma, CA (US)

(72) Inventor: William F. Hammett, Sonoma, CA (US)

(*) Notice: Subject to any disclaimer, the term of this patent is extended or adjusted under 35 U.S.C. 154(b) by 0 days.

(21) Appl. No.: 16/286,035

(22) Filed: Feb. 26, 2019

(65) Prior Publication Data

US 2019/0269032 A1   Aug. 29, 2019

Related U.S. Application Data

(60) Provisional application No. 62/635,072, filed on Feb. 26, 2018.

(51) Int. Cl.
*H05K 7/20* (2006.01)
(52) U.S. Cl.
CPC ....... *H05K 7/20145* (2013.01); *H05K 7/2059* (2013.01); *H05K 7/20172* (2013.01)

(58) Field of Classification Search
CPC ............. B65D 88/76; F24F 13/20; E04H 9/12
USPC ........................... 454/48, 173–184; 52/169.6
See application file for complete search history.

(56) References Cited

U.S. PATENT DOCUMENTS

| 6,304,444 B1* | 10/2001 | Combs ................. H05K 7/2059 |
| | | 165/80.3 |
| 2014/0117018 A1* | 5/2014 | Burke ...................... H02G 9/10 |
| | | 220/484 |

* cited by examiner

*Primary Examiner* — Vivek K Shirsat
(74) *Attorney, Agent, or Firm* — Skaar Ulbrich Macari, P.A.

(57) ABSTRACT

An underground equipment vault system having a body or casing, an intake duct, an intake vent, one or more equipment hangers, an exhaust duct, an exhaust vent, and one or more ventilated compartments. The underground vault system is configured to improve air flow from underneath, or from a low portion of, the body of the vault, provide flexible positioning or location options for the intake vents and the exhaust vents away from the vault body, cool the intake air, and reduce the noise impact of the vault.

20 Claims, 6 Drawing Sheets

UNDERGROUND EQUIPMENT VAULT SYSTEM

PRIORITY

This application claims priority to and the benefit of U.S. Provisional Patent Application No. 62/635,072, filed Feb. 26, 2018, which is incorporated fully herein by reference.

FIELD

The present invention relates generally to equipment housing systems and, more particularly, to underground equipment vaults to house various elements and components used in the wireless telecommunications, and other, industries.

BACKGROUND

The natural progression in the wireless telecommunications industry, as the demand for service has grown, has been from high sites covering wide areas to a larger number of lower sites covering smaller areas—driven by the limited service capacity of any one site. Currently, the coverage of individual "cells" is a matter of blocks, and the common siting is on utility poles and light poles, with an antenna on top and two or three equipment boxes on the side.

Most of these poles are located in public rights-of-way, to which wireless carriers have certain access rights. This leaves local jurisdictions with a limited ability to influence the proliferation of these sites, with visual impact being a key aesthetic consideration. This has led to direction from the jurisdictions to place the equipment boxes underground, which in turn triggers the requirement that such placement not violate the subject jurisdiction's limits on noise, e.g., noise from fans that are included within the vaults to promote improved ventilation. It is noted that each jurisdiction typically has its own noise limits, which can vary significantly.

As a result, there is a need for a new and improved underground equipment vault system or assembly that solves the innate functional and design flaws of conventional configurations and approaches.

SUMMARY

Embodiments of the present invention include an underground equipment vault system comprising a body or casing, one or more intake ducts, one or more intake vents, one or more equipment hangers, one or more exhaust ducts, one or more exhaust vents, and one or more ventilated compartments. In various embodiments, the system can further include an intake well and one or more fan devices. The underground vault system is configured to facilitate the flow of air, whether or not the flow is aided by fans, across cooling fins of equipment boxes within the system. The system brings air from below the equipment boxes, using baffles or other elements, or the location of the air entry to the vault itself, such that air flows vertically over the fins.

Key aspects of the invention include improved air flow from underneath, or from a bottom/low portion of, the body of the vault, flexible positioning or location options for the intake vents and the exhaust vents away from the vault body, cooling of intake air, and improved interior ventilation compartments.

The above summary is not intended to describe each illustrated embodiment, claimed embodiment or implementation of the invention. The detailed technology and preferred embodiments implemented for the subject invention are described in the following paragraphs accompanying the appended drawings for people skilled in this field to well appreciate the features of the claimed invention. It is understood that the features mentioned hereinbefore and those to be commented on hereinafter may be used not only in the specified combinations, but also in other combinations or in isolation, without departing from the scope of the present invention.

BRIEF DESCRIPTION OF THE DRAWINGS

The invention may be more completely understood in consideration of the following detailed description of various embodiments of the invention in connection with the accompanying drawings, in which.

Figure 1:
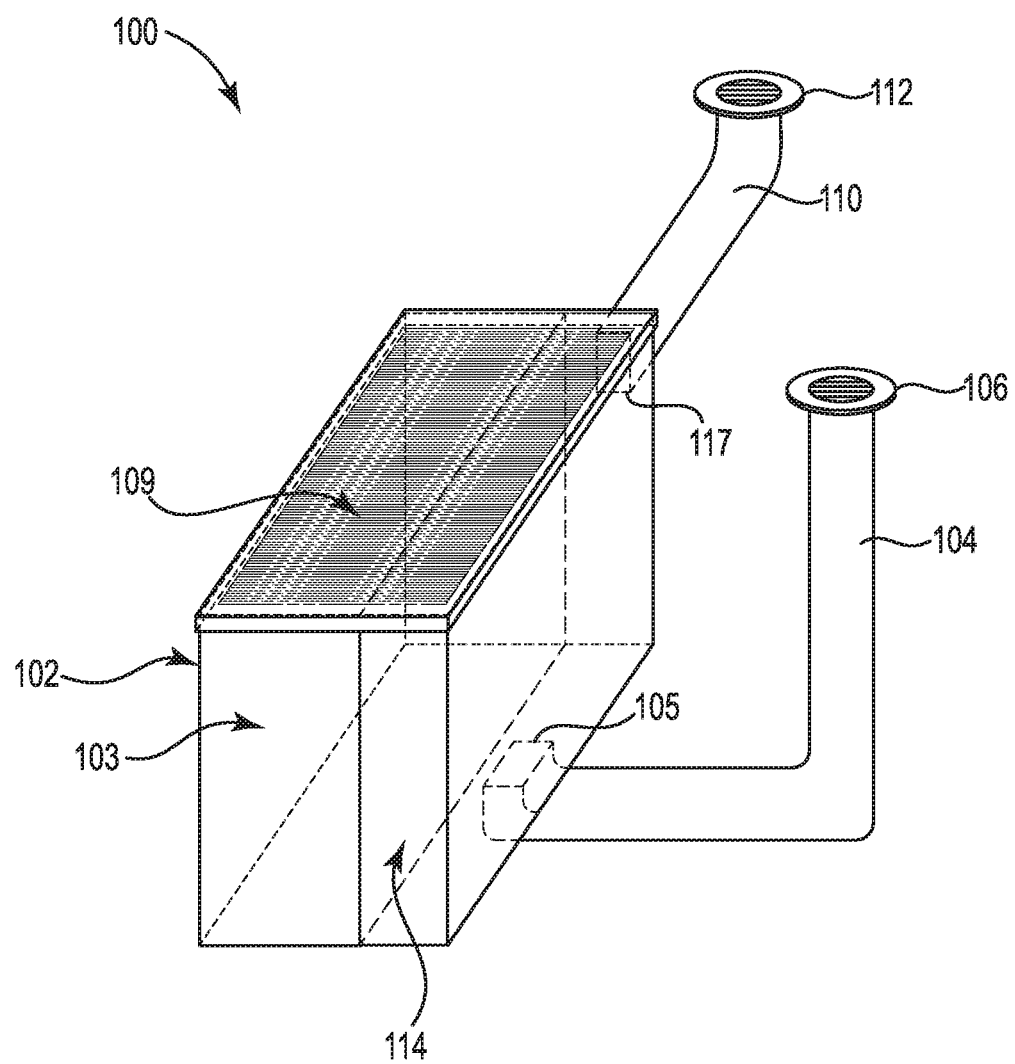
FIG. 1 shows a perspective view of an underground equipment vault system with flexible or adaptable venting features and a ventilating chamber, in accordance with embodiments of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the invention is to cover all modifications, equivalents, and alternatives falling within the spirit and scope of the invention as defined by the appended claims.

DETAILED DESCRIPTION

Referring generally to FIGS. 1-5, an equipment vault system 100 for placement under the ground G is disclosed. The system 100 can comprise a body or casing 102, one or more intake ducts 104, one or more intake vents 106, one or more equipment hangers 108, one or more exhaust ducts 110, one or more exhaust vents 112, and one or more ventilated compartments 114. In various embodiments, the system 100 can further include an intake well 116 and one or more fan devices 118. An intake vent port 105 and an exhaust vent port 117 are defined in the body 102 for fluid communication with the respective ducts 104, 110.

A lid 109 or like structure is provided to cover the top portion of the body 102. The lid 109 can be hinged or otherwise displaceable or removable with respect to the body 102.

The body 102 and other components or elements of the present invention can be constructed in whole, or in part, of concrete, plastic, metal, and the like. The underground vault system 100 is configured to facilitate the flow of air, whether or not the flow is aided by fans 118, across equipment boxes 120 within at least the ventilated compartment 114 of the system 100. Cooling fins or baffles can be aligned vertically within the compartment 114, or other portions of the body 102. While air flow in typical vaults is still largely horizontal, the vault system 100 of the present invention brings air from below the equipment boxes 120, using baffles 115 or other elements (or the low entry location of the air into the vault itself), such that air flows vertically over the fins.

Key aspects of the invention include improved air flow from underneath the body 102 or at a low or bottom portion of the body 102, flexible positioning or location options for the intake vent 106 and the exhaust vent 112 at a myriad of selective locations away from the body 102, cooling of intake air, and improved interior compartments (e.g., 114), just to name a few.

Figure 2:
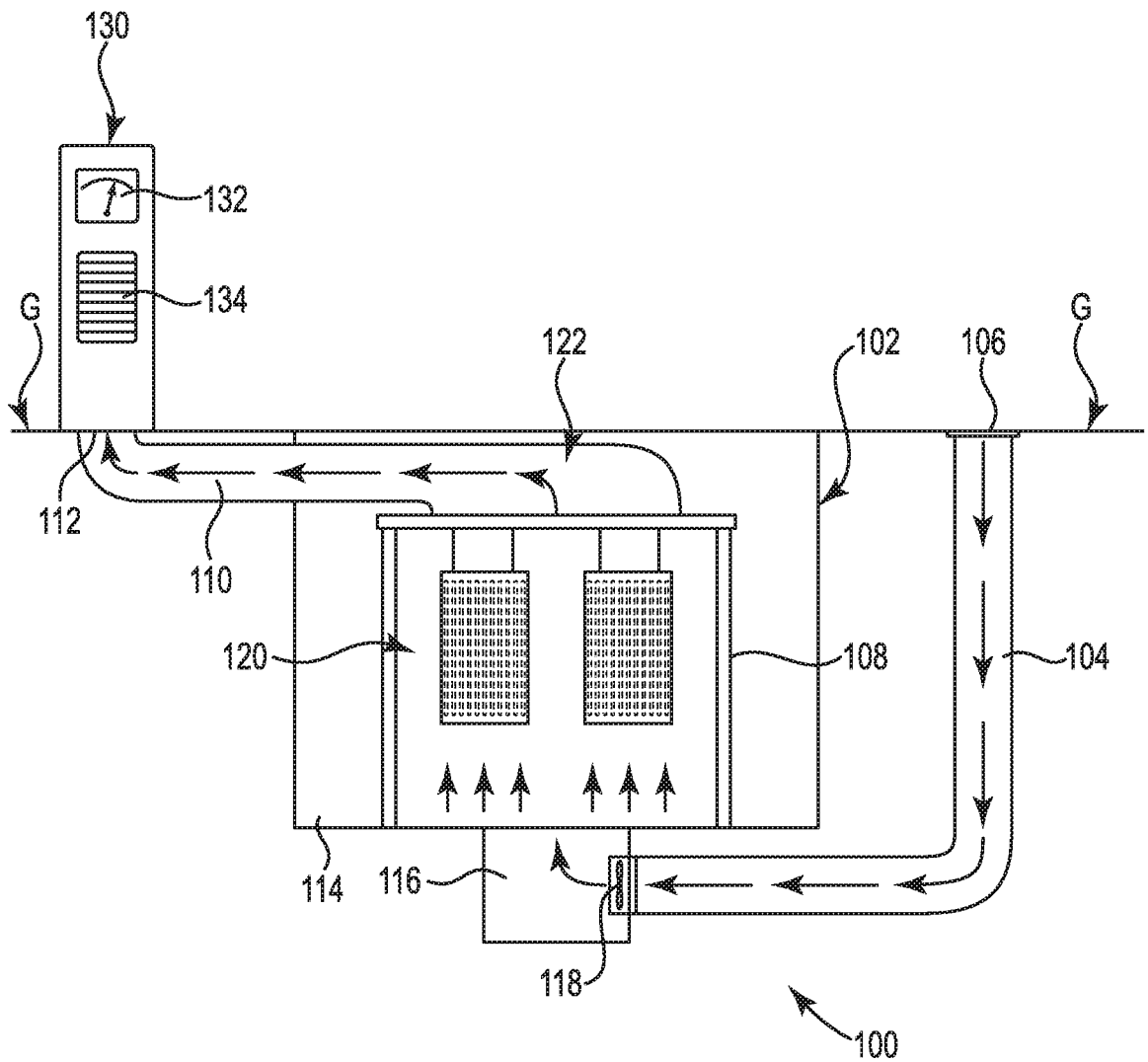
FIG. 2 shows a front view of an underground equipment vault system and corresponding low-to-high air flow and ventilation, in accordance with embodiments of the present invention.
Figure 3:
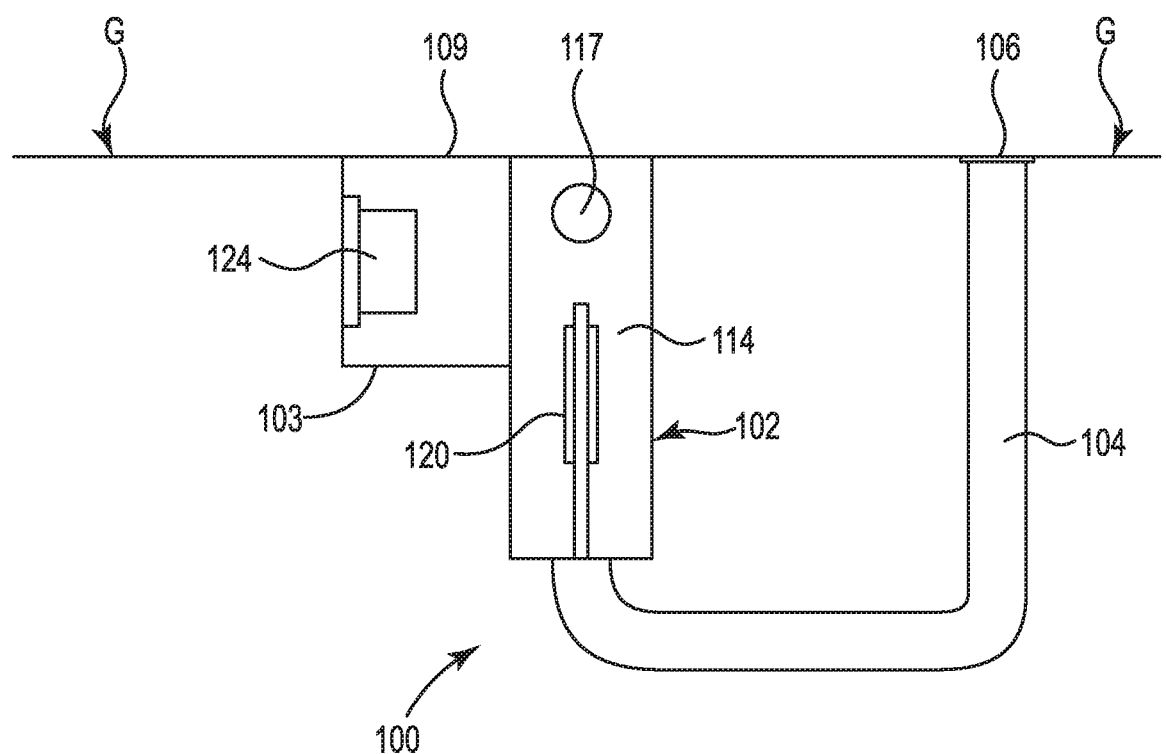
FIG. 3 shows a side view of an underground equipment vault system having adaptable venting features and a ventilating chamber, and a bottom wall intake port, in accordance with embodiments of the present invention.

As illustrated in FIGS. 1-3, the intake vent 106 is selectively positioned outside of and a distance from the vault casing or body 102. This allows placement of the vent 106 (e.g., the principal noise source for a vault, especially when fans 118 are installed) at a selective distance from any nearby properties or property lines (the typical location for noise assessment). Further, length of the intake duct 104 and its deep routing (e.g., as deep as, or deeper than) the vault body 102 serves to cool the air entering the body 102—which also increases the thermal performance of the air flow itself. Again, the exhaust vent 112 is also adapted for varying placement away from the vault body 102. The shape, size, path, length, and the overall selective configuration of the ducts 104, 110 relative to the vault body 102 provides key flexibility or adaptability to facilitate the cooling, air flow, and noise reduction benefits of the present invention, with different installation sites potentially requiring unique configurations and setups. In various embodiments, the intake duct 104 can be directed to the bottom portion or wall of the body 102 via the intake port 105 (e.g., FIGS. 1-3), while other embodiments can include the intake port 105 along a side wall or portion of the body 102 (e.g., FIG. 3a). The present invention allows for these unique and adaptive configurations to achieve the benefits identified herein.

As shown in FIG. 2, a pedestal 130 can be in operable communication with the exhaust vent 112, with the pedestal 130 optionally including a power meter 132, one or more vents 134, and other various structures, components, equipment, and elements. In embodiments where the system 100 is to be sited in an area where an open grate can be used in lieu of or as a solid lid or cover 109, then the heated air at the top of the equipment boxes 120 can be vented straight through the cover 109, with no separate exhaust vent required. Even with such embodiments, e.g., if a fan 118 is installed, a solid cover 109 and exhaust vent 112 can be employed to reduce noise. As stated, the disclosure provided herein relating to noise reduction in the intake vent 106 can also apply to the exhaust vent 112. However, because an air-flow shroud 122 on top of the equipment boxes (to route heated air to the exhaust opening) is mounted relatively high in the vault, and because the natural air flow is upward, the duct length available to reach the exhaust vent 112 from the vault's exhaust opening 117 may be limited in various embodiments. At some sites, certain equipment (such as a power company's meter) is provided in the pedestal 130 next to the vault system 100. If the pedestal 130 is constructed with a hollow base column, or like construct, then fitting it with vents 134 and placing it over the exhaust vent 112 would further improve air flow, due to the additional height.

For those embodiments of the system 100 including intake fans 118, the fans 118 are generally positioned at or near the entry points for the intake ducts 104 (FIG. 2). It should be noted that the exhaust ducts 110 do not generally include fans due to the proximity to the exhaust vent 112, but fans 118 could be included with various embodiments, and at various locations of the vault, where the construct of the system 100 permits it, and where fans 118 would be beneficial to facilitate air flow.

Additional duct 104 length and/or fins, or like elements, on the inside of the duct 104 conduit can be included to cool the air further—which can also assist in reducing the noise impact if one or more fans 118 are installed in the system 100. Moreover, the intake vent 106 and exhaust vent 112 can be fitted with hooded covers to further reduce noise in certain directions, and the material, shape, and lining configurations of the ducts 104, 110 can be optimally selected to also facilitate noise reduction. In cases of high airflow needs, multiple vents 106, 112 and/or ducts 104, 110 can be installed, either entering the casing a separate portions of the body 102, or together at the intake well 116, or like structures of the body 102.

The ventilated compartment 114 is a relatively narrow area for mounting the one or more equipment boxes 120 to be cooled, and to control airflow. Examples of equipment or components that could be included in embodiments of the equipment boxes 120 can include transmitters, batteries, and the like. The equipment boxes 120 can be mounted next to or opposite each other on one or more racks 108 that slide onto one or more posts 108b, thereby allowing the units to be pulled upward out of the body 102 for servicing.

Figure 3A:
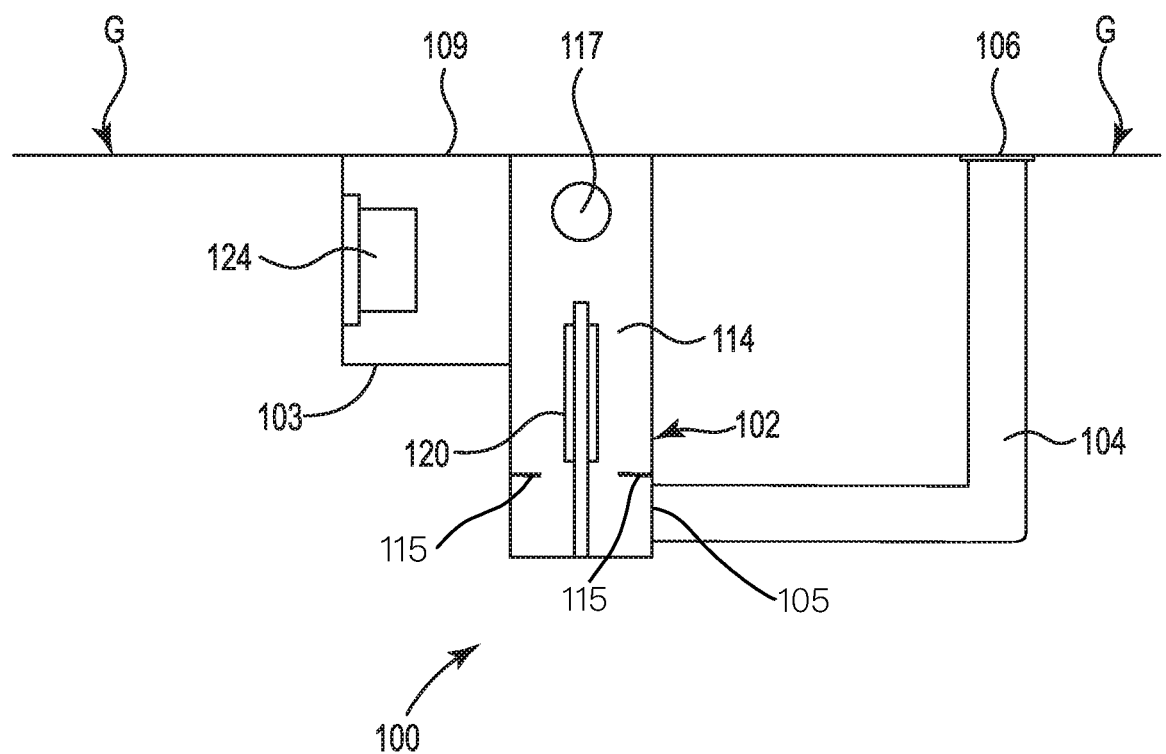
FIG. 3a shows a side view of an underground equipment vault system having adaptable venting features and a ventilating chamber, and a low side wall intake port, in accordance with embodiments of the present invention.

As shown in FIG. 3a, one or more baffles 115 can be included to assist in directing air flow from below, or from the side of, the body 102 such that the air flows vertically within the ventilated compartment 114 and across the equipment boxes 120. Other than the baffles 115 and the exhaust shroud 122, no other equipment would generally be mounted in the ventilated area 114 with certain embodiments. Baffles 115 can be included in various embodiments to assist in facilitating air flow, irrespective of where the intake port 105 is located. For instance, the intake port 105 can be located below the equipment boxes 120, but this can include intake ports included at the bottom walls, the side walls, etc., such that the baffles 115 can be provided to further channel or direct the air flow over the equipment boxes 120. Equipment such as circuit breakers 124, fiber/telephone connections, status monitoring equipment, etc. would be typically located in an adjoining space or area 103, or in a separate vault.

Figure 4:
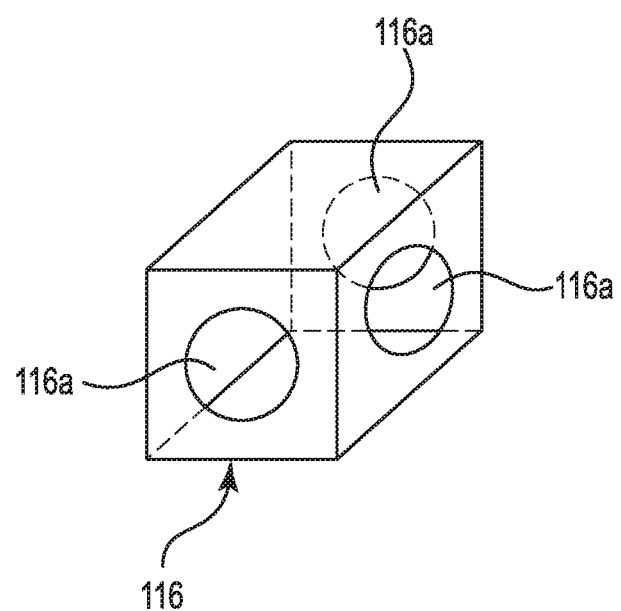
FIG. 4 shows a perspective view of an exemplary intake well structure for an underground equipment vault system, in accordance with embodiments of the present invention.

Referring to FIG. 4, an exemplary intake well 116 is depicted. To permit for flexible inclusion of intake ducts 104 extending to and communicating with the vault body 102, the intake well 116 can include one or more apertures or breakouts sections 116a. As such, duct openings can be created as needed to accommodate the number and positioning of the corresponding intake ducts 104 being connected to the system 100.

Figure 5:
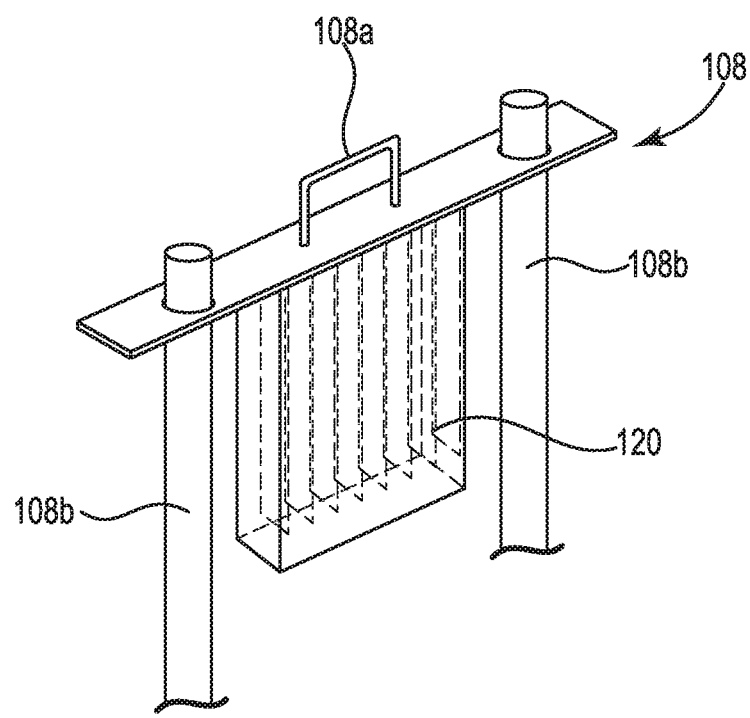
FIG. 5 shows a perspective view of an exemplary equipment hanger for housing within an underground equipment vault system, in accordance with embodiments of the present invention.

FIG. 5 depicts an embodiment of an equipment hanger or rack 108 including a handle 108a and one or more mounting posts 108b such that the equipment boxes 120 are removably or slidably housed within the ventilated compartment 114 of the system 100.

To keep the interior of the vault system 100 dry, small sump pumps can be included, e.g., two (for redundancy) in the intake well or in the lowest part of the casing. In addition, the vents can include filters or like devices, and funnel/ring water-capture fittings to prevent water from entering the system 100 through the intake or exhaust vents 106, 112.

The present invention may be embodied in other specific forms without departing from the spirit or essential attributes thereof, and it is, therefore, desired that the present embodiment be considered in all respects as illustrative and not restrictive. Similarly, the above-described methods and techniques for providing and using the present invention are illustrative processes and are not intended to limit the methods of manufacturing the present invention to those specifically defined herein. Further, features and aspects of the various embodiments described herein can be combined to form additional embodiments within the scope of the invention even if such combination is not specifically described herein.

What is claimed is:

1. An underground equipment vault system, comprising:
    a vault housing placeable under a ground level and including:
        a top portion proximal to the ground level;
        a bottom wall portion;
        one or more vertical side wall portions transverse to the bottom wall portion;
        at least one lower intake port defined in the bottom wall portion, distal to the ground level and the top portion, and arranged to facilitate upward air flow through the vault housing;
        a ventilation chamber in fluid communication with the at least one lower intake port and configured to house at least one equipment component; and
    an intake duct having an intake vent end and an intake port end, with the intake port end in fluid communication with the at least one lower intake port.

2. The system of claim 1, further including an exhaust port provided above the at least one lower intake port, wherein the upward air flow travels vertically from the at least one intake port, across the at least one equipment component, and through the exhaust port.

3. The system of claim 1, wherein the intake vent end is in fluid communication with an ambient air environment.

4. The system of claim 1, wherein the at least one lower intake port includes an intake well, with the intake well including one or more fans to facilitate the upward air flow.

5. The system of claim 1, wherein the at least one lower intake port is included below the at least one equipment component.

6. The system of claim 1, wherein the at least one equipment component includes at least one electronic equipment box.

7. The system of claim 1, further including an intake well in fluid communication with the intake duct and the at least one lower intake port.

8. The system of claim 1, further including an intake fan provided at the at least one lower intake port.

9. The system of claim 1, further including one or more equipment hangers provided within the ventilation chamber.

10. The system of claim 1, further including one or more air baffles provided within the ventilation chamber.

11. An underground equipment vault system, comprising:
    a vault housing placeable under a ground level and including;
        a top wall portion proximal to the ground level;
        a bottom wall portion;
        first and second side wall portions extending transversely between the top wall portion and the bottom wall portion;
        at least one intake port defined distal to the ground level and the top wall portion;
        a ventilation chamber in fluid communication with the at least one intake port and configured to house at least one equipment component;
    an intake duct having an intake vent end and an intake port end, with the intake port end in fluid communication with the at least one intake port; and
    an upper exhaust port provided above the at least one intake port, wherein air flows upward from the at least one intake port, across the at least one equipment component, and through the exhaust port.

12. The system of claim 11, wherein the upper exhaust port is provided in one of the first and second side wall portions.

13. The system of claim 11, wherein the intake vent end is in fluid communication with an ambient air environment.

14. The system of claim 11, wherein the at least one equipment component includes at least one electronic equipment box.

15. The system of claim 11, further including an intake well in fluid communication with the intake duct.

16. The system of claim 11, further including an intake fan provided at the at least one intake port.

17. The system of claim 11, further including one or more equipment hangers provided within the ventilation chamber.

18. The system of claim 11, further including one or more air baffles provided within the ventilation chamber.

19. The system of claim 11, wherein the at least one intake port is included with the bottom wall portion.

20. The system of claim 11, wherein the at least one intake port is included with at least one of the first and second side wall portions.

* * * * *